March 21, 1967 J. S. SENEY 3,310,439
PHOTOVOLTAIC CELL WITH WAVE GUIDE
Filed Nov. 14, 1961
FIG. I
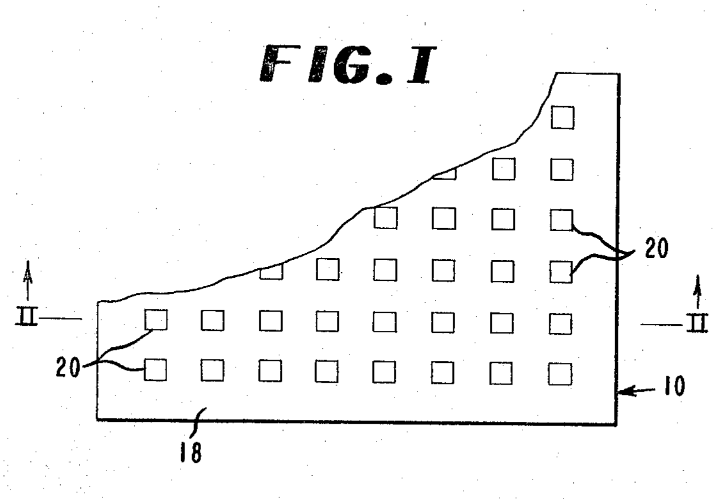
FIG. II
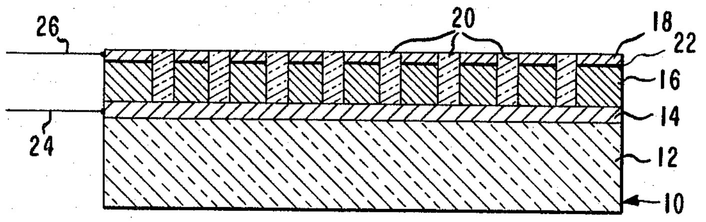
FIG. III
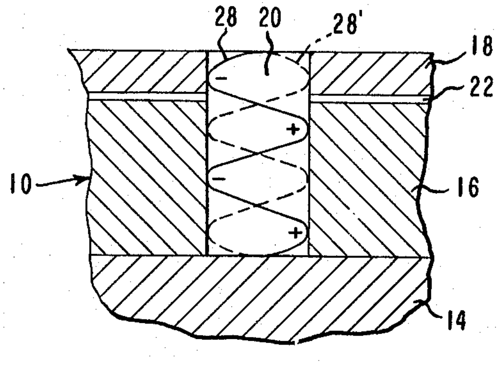

3,310,439

PHOTOVOLTAIC CELL WITH WAVE GUIDE

John S. Seney, Seaford, Del., assignor to E. I. du Pont de Nemours and Company, Wilmington, Del., a corporation of Delaware Filed Nov. 14, 1961, Ser. No. 152,317
5 Claims. (Cl. 136—89)

This invention relates generally to the conversion of energy and more particularly to energy conversion devices of the photovolatic or solar cell type.

The production of solar cells by depositing films or layers of semi-conductor materials on a suitable substrate is well known. It is also known that recent efforts in this field have been directed toward the provision of thinner layers for purposes of economy but that such economies must necessarily be balanced against a resulting loss in efficiency.

It is accordingly the most important object of my invention to provide an improved construction with which a significant increase in the efficiency of solar cells may be achieved.

Another important object of the present invention is the provision of a solar cell which is sensitive to radiations of a given frequency and is therefore adapted for use as a detector.

These worthwhile objectives are accomplished in an energy conversion device which is adapted for exposure to radiant energy and which includes adjacent N and P semi-conductor layers separated by a rectifying barrier. A plurality of spaced dimensioned crystals is embedded in the semi-conductor layers. These crystals are passive to the incident radiant energy and have a width dimension equal to a particular wave length. At the same time, the layers and crystals have a depth equal to or greater than that wave length.

Other objectives will become apparent in the following specification wherein reference is made to the accompanying drawing in which:

FIGURE 1 is a fragmentary plan view of a solar cell made in accordance with the teachings of the present invention;

FIG. 2 is a vertical sectional view taken on line II—II of FIG. 1;

FIG. 3 is a fragmentary enlargement, also taken on line II—II of FIG. 1.

The solar cell construction 10 chosen for purposes of illustration is comprised of a glass base 12, a conductive substrate 14 of aluminum, a pair of semi-conductor layers 16, 18 and a plurality of crystals 20. Layers 16, 18 are separated by a conventional rectifying barrier 22. Lead wires 24, 26 are connected electrically to the conductive substrate 14 and to the upper layer 18, respectively.

Barrier 22 is the interface or boundary between layers 16, 18, one of which consists of N-type semi-conductor material, the other of P-type. If, for example, layer 16 is of selenium, germanium or P-type silicon, the layer 18 should be of cadmium or other N-type material. The only requirement in this respect is that there be adjacent N and P layers separated by a rectifying barrier.

The spaced, embedded crystals 20 shown in the drawing are square in cross-section. Their width corresponds to a given wave length whereas their depth and the depth of layers 16, 18 is equal to or greater than that wave length. Although square crystals have been illustrated, it is apparent that hexagonal and other cross-sections may also be employed. A further requirement is that the crystals be of a material which is passive or transparent to a particular wave length of the incident radiant energy. For example, silicon crystals are passive or transparent to a peak wave length of 0.7 micron.

In the fabrication of cell 10, conductive substrate 14 is applied to the non-conductive, smooth surfaced base 12 by plating, evaporative deposition or any other suitable coating procedure. The dimensioned crystals 20 are dusted on or precipitated out of solution and simultaneously aligned by subjecting them to the influence of a magnetic field, for example, by the use of an electron gun. Layers 16, 18, are successively deposited on substrate 14 in surrounding relationship to crystals 20 by evaporation or an equivalent technique. Any excess material is removed so that crystals 20 will be exposed to incident radiant energy when cell 10 is placed in use.

When sized and dimensioned as described above, each crystal 20 functions as a wave guide in that a standing wave of the incident radiant energy forms therein. The particular standing wave 28 shown in FIG. 3 is at a peak plus potential in the area of the lower layer 16 and at a peak minus potential in the area of layer 18. Since they are electromagnetic, these standing waves influence the semi-conductor materials and cause an electron flow across barrier 22 from the N-type layer 18 to the P-type layer 16, i.e., there is a rectified flow of current in leads 24, 26. When wave 28 is in the alternate position 28', there is no electron flow across barrier 22 and no current flows in leads 24, 26.

Full wave rectification can be accomplished by stacking an additional pair of semi-conductor layers on the layers 16, 18 in surrounding relationship to crystals 20, i.e., in a cell construction having successive N, P, P, N layers. Appropriate electrical connections are made to the several layers.

In view of the wave guide principle of operation, the cell construction disclosed herein has particular utility in those situations and applications where the detection of a particular wave length in a given spectrum is important. By the same token, a significant increase in efficiency can be achieved in those situations where a photovoltaic cell is exposed only to energy having a wave length corresponding to the crystal dimensions. Furthermore, since the surface of layer 18 remains available for exposure in the conventional manner, the provision of crystals 20 and the resulting direct exposure of the photosensitive barrier 22 to a particular wave length of the incident radiant energy can only lead to a significant increase in the conductive efficiency of an otherwise conventional light-sensitive device when it is exposed to a broad spectrum. In the latter situation, a further increase in efficiency can be achieved by employing crystals of a different width in each cell or by the provision of tapered crystals, each sensitive to a wide spectrum of frequencies.

From the foregoing, it is apparent that the cell construction disclosed herein is of general utility in any situation or application where light sensitive devices are employed. It is also apparent that many changes, including structural modifications and the choice of other materials, may be made in the disclosed solar cell without departing from the spirit of the present invention which is accordingly intended to be limited only by the scope of the appended claims.

Having thus described the invention, what is claimed as new and desired to be secured by Letters Patent is:

1. A photoelectric conversion device adapted for exposure to incident radiant energy, said device comprising:
   a non-conductive base having a substantially smooth surface;
   a plurality of spaced crystals fixed to said surface,
      said crystals being passive to said incident radiant energy;
   a body of semi-conductor material fixed to said surface in surrounding relationship to said crystals,
      said body including adjacent N and P layers separated by a rectifying barrier,
      said crystals being exposed to said radiant energy and consisting of a material differing chemically from said semi-conductor material; and a pair of conductors connected electrically to said N and P layers, respectively.

2. In a photoelectric conversion device including adjacent N and P semi-conductor layers which are separated by a rectifying barrier and adapted for connection to electrical conductors, a plurality of spaced dimensioned crystals embedded in and extending through said layers, said crystals being passive to incident radiant energy and having a width dimension equal to a particular wave length of said incident radiant energy, said layers and said crystals having a depth equal to or greater than said wave length.

3. A solar cell comprising:

a non-conductive base having a substantially smooth surface;

a conductive substrate on said surface;

a plurality of spaced transparent crystals fixed to said substrate;

a body of semi-conductor material fixed to said substrate in surrounding relationship to said crystals, said body including adjacent N and P layers separated by a rectifying barrier, said crystals being exposed and having a width dimension equal to a particular wave length of the incident light, said layers and said crystals having a depth equal to or greater than said wave length;

and a pair of conductors connected electrically to said N and P layers, respectively.

4. In a solar cell including adjacent N and P semi-conductor layers separated by a barrier junction and adapted for connection to electrical conductors, a plurality of spaced dimensioned crystals embedded in said layers, said crystals being exposed and having a width dimension equal to the wave length of an incident light ray, said layers and said crystals having a depth equal to or greater than said wave length.

5. A solar cell having an intermediate barrier layer, an electrical connection on each side of the layer and a plurality of spaced transparent crystals embedded therein, each crystal passing through said barrier layer and being dimensioned to function as a wave guide for a particular wave length of the incident light to which it is exposed.

References Cited by the Examiner

UNITED STATES PATENTS

| | | | |
|---|---|---|---|
| 2,904,613 | 9/1959 | Paradise | 136—89.05 |
| 2,919,299 | 12/1959 | Paradise | 136—89 |

WINSTON A. DOUGLAS, *Primary Examiner.*

JOHN H. MACK, *Examiner.*

J. H. BARNEY, A. M. BEKELMAN, *Assistant Examiners.*